(12) United States Patent
Chen

(10) Patent No.: US 7,998,855 B2
(45) Date of Patent: Aug. 16, 2011

(54) SOLVING VIA-MISALIGNMENT ISSUES IN INTERCONNECT STRUCTURES HAVING AIR-GAPS

(75) Inventor: Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/963,293

(22) Filed: Dec. 8, 2010

(65) Prior Publication Data
US 2011/0076831 A1 Mar. 31, 2011

Related U.S. Application Data

(63) Continuation of application No. 11/933,929, filed on Nov. 1, 2007, now Pat. No. 7,868,455.

(51) Int. Cl.
*H01L 21/4763* (2006.01)
(52) U.S. Cl. .................. 438/619; 257/E21.581
(58) Field of Classification Search .................. 438/619, 438/637; 257/E21.581
See application file for complete search history.

(56) References Cited

U.S. PATENT DOCUMENTS

| | | | |
|---|---|---|---|
| 6,037,249 A | 3/2000 | Chiang et al. | |
| 6,159,845 A * | 12/2000 | Yew et al. | 438/637 |
| 6,214,719 B1 | 4/2001 | Nag | |
| 6,399,476 B2 | 6/2002 | Kim et al. | |
| 7,842,600 B2 * | 11/2010 | Yun et al. | 438/619 |
| 2005/0074961 A1 | 4/2005 | Beyer et al. | |
| 2007/0178713 A1 | 8/2007 | Jeng | |

FOREIGN PATENT DOCUMENTS
CN 101009266 A 8/2007
* cited by examiner

*Primary Examiner* — Jenny L. Wagner
(74) *Attorney, Agent, or Firm* — Slater & Matsil, L.L.P.

(57) ABSTRACT

An integrated circuit structure is provided. The integrated circuit structure includes a semiconductor substrate; and a metallization layer over the semiconductor substrate. The metallization layer includes a conductive line; a low-k dielectric region adjacent and horizontally spaced apart from the conductive line by a space; and a filler dielectric material filling at least a portion of the space, wherein the filler dielectric material and the low-k dielectric region are formed of different materials. The integrated circuit structure further includes a capping layer over and adjoining the filler dielectric material and the low-k dielectric region. The filler dielectric material has a dielectric constant (k value) less than a k value of the capping layer.

20 Claims, 8 Drawing Sheets

SOLVING VIA-MISALIGNMENT ISSUES IN INTERCONNECT STRUCTURES HAVING AIR-GAPS

This application is a continuation of U.S. patent application Ser. No. 11/933,929, entitled "Solving Via-Misalignment Issues in Interconnect Structures Having Air-Gaps," filed on Nov. 1, 2007, which application is incorporated herein by reference.

TECHNICAL FIELD

This invention relates generally to integrated circuits, and more particularly to methods for reducing the effects of damaged low-k dielectric layers.

BACKGROUND

As the semiconductor industry introduces new generations of integrated circuits (IC) having higher performance and more functionality, the density of the elements forming the ICs increases, while the dimensions, sizes, and spacing between components or elements are reduced. In the past, such reductions were limited only by the ability to define the structures photo-lithographically, and device geometries having smaller dimensions create new limiting factors. For example, for any two adjacent conductive features, as the distance between the conductive features decreases, the resulting capacitance (a function of the dielectric constant (k value) of the insulating material divided by the distance between the conductive features) increases. This increased capacitance results in increased power consumption and increased resistive-capacitive (RC) delay. Therefore, the continual improvement in semiconductor IC performance and functionality is dependent upon developing materials with low k values.

Since the material with the lowest dielectric constant is air or vacuum (k=1.0), low-k dielectric materials typically comprise porous materials. Furthermore, air-gaps are formed to further reduce effective k values.

FIGS. 1A through 1C illustrate a conventional process for forming an interconnect structure with air-gaps. Referring to FIG. 1A, copper lines 4 and corresponding diffusion barrier layers 5 are formed in inter-metal dielectric 6, which has a low k value, and contains a high concentration of carbon. During the formation of copper lines 4, portions 8 of inter-metal dielectric 6, which were exposed during the formation of copper lines 4, are damaged, and hence have a low concentration of carbon. The damaged low-k dielectric portions 8 have a high k value, which may be as high as about 7, causing a significant increase in the overall parasitic capacitance. The damaged portions 8 are etched to form air-gaps 10, as illustrated in FIG. 1B. Subsequently, as shown in FIG. 1C, etch stop layer (ESL) 12 is formed, followed by the formation of the metal lines 19 and vias 18.

Although the formation of air-gaps 10 reduces the parasitic capacitance of the interconnect structure, the conventional process suffers from drawbacks. When ESL 12 is formed, due to the exposure of air-gaps 10, ESL 12 will be filled into air-gaps 10. Typically, ESL 12 is formed of materials having a greater dielectric constant than that of low-k dielectric 6. As a result, the line capacitances between copper lines 4 are increased. Experiment results have revealed that the formation of air-gaps 10 results in the line capacitances to be reduced by about 14 percent. However, after the formation of ESL 12, the line capacitances are only about 4.0 percent lower than the line capacitances before air-gaps 10 are formed. The benefit of having air-gaps is thus significantly compromised.

A further problem is that air-gaps 10 may cause diffusion barrier layer 16 to be discontinuous. When a misalignment occurs and vias 18 land over air-gaps 10, the corresponding portions of diffusion barrier layer 16 also land over air-gaps 10. As a result, copper will fall into air-gaps 10 during the formation of vias 18, and may diffuse into air-gaps 10 even after the formation of vias 18. In turn, copper may diffuse into inter-metal dielectric 6, causing the degradation of the integrated circuit. This also means that the misalignment window for forming vias 18 is significantly reduced.

Accordingly, what is needed in the art is an interconnect structure that may incorporate steps for removing damaged low-k dielectric layers thereof to take advantage of the benefits associated with reduced parasitic capacitances while at the same time overcoming the deficiencies of the prior art.

SUMMARY OF THE INVENTION

In accordance with one aspect of the present invention, an integrated circuit structure includes a semiconductor substrate; and a metallization layer over the semiconductor substrate. The metallization layer includes a conductive line; a low-k dielectric region adjacent and horizontally spaced apart from the conductive line by a space; and a filler dielectric material filling at least a portion of the space, wherein the filler dielectric material and the low-k dielectric region are formed of different materials. The integrated circuit structure further includes a capping layer over and adjoining the filler dielectric material and the low-k dielectric region. The filler dielectric material has a dielectric constant (k value) less than a k value of the capping layer, which may be an etch stop layer.

In accordance with another aspect of the present invention, an integrated circuit structure includes a semiconductor substrate; a low-k dielectric layer over the semiconductor substrate; a conductive line in the low-k dielectric layer; and a filler dielectric material horizontally between the low-k dielectric layer and the conductive line. The filler dielectric material adjoins the low-k dielectric layer. The filler dielectric material and the low-k dielectric layer have different k values. The integrated circuit structure further includes a capping layer over and adjoining the filler dielectric material and the low-k dielectric layer, wherein the filler dielectric material has a k value lower than a k value of the capping layer.

In accordance with yet another aspect of the present invention, an integrated circuit structure includes a semiconductor substrate; an etch stop layer (ESL) over the semiconductor substrate; a low-k dielectric layer over and adjoining the etch stop layer; and a filler material over the etch stop layer and adjoining the etch stop layer and the low-k dielectric layer. The filler material encircles an air-gap. The filler material and the low-k dielectric layer can be formed of different dielectric materials.

In accordance with yet another aspect of the present invention, a method for forming an integrated circuit structure includes providing a semiconductor substrate; forming a low-k dielectric layer over the semiconductor substrate; forming a conductive line in the low-k dielectric layer; after the step of forming the low-k dielectric layer, forming a filler dielectric material horizontally between the conductive line and the low-k dielectric layer, wherein the filler dielectric material adjoins the low-k dielectric layer; and forming a capping layer on and adjoining the filler dielectric material and the low-k dielectric layer, wherein the filler dielectric material has a k value lower than a k value of the capping layer, which can be a capping layer or an etch stop layer.

In accordance with yet another aspect of the present invention, a method for forming an integrated circuit structure includes providing a semiconductor substrate; forming a low-k dielectric layer over the semiconductor substrate; forming a conductive line in the low-k dielectric layer, whereby a k value of portion of the low-k dielectric layer adjacent the conductive line is increased, forming a damaged layer; removing the damaged layer to form an air-gap; filling a filler dielectric material into the air-gap; planarizing the filler dielectric material until the conductive line is exposed; and forming an etch stop layer on the filler dielectric material and the low-k dielectric layer.

The advantageous features of the present invention include reduced parasitic capacitance, reduced electro-migration, improved time dependent dielectric breakdown, and improved misalignment windows.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention provides methods for reducing parasitic capacitances in interconnect structures and for reducing the adverse effects of via-misalignment in the formation of interconnect structures. The intermediate stages of manufacturing preferred embodiments of the present invention are illustrated. Throughout the various views and illustrative embodiments of the present invention, like reference numbers are used to designate like elements.

Figure 1A:
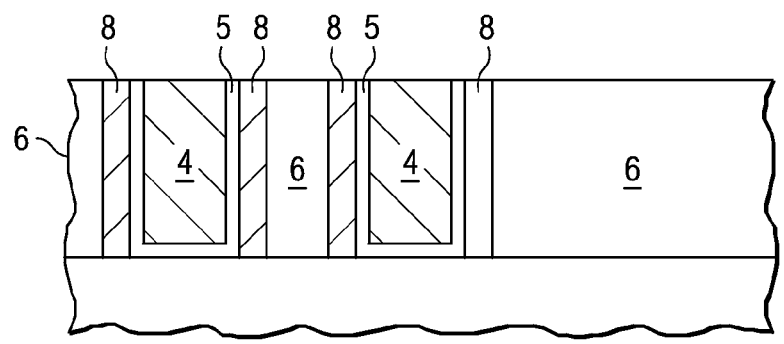
FIGS. 1A, 1B, and 1C illustrate a conventional process for forming air-gaps, wherein damaged low-k dielectric portions are etched to form air-gaps.
Figure 1B:
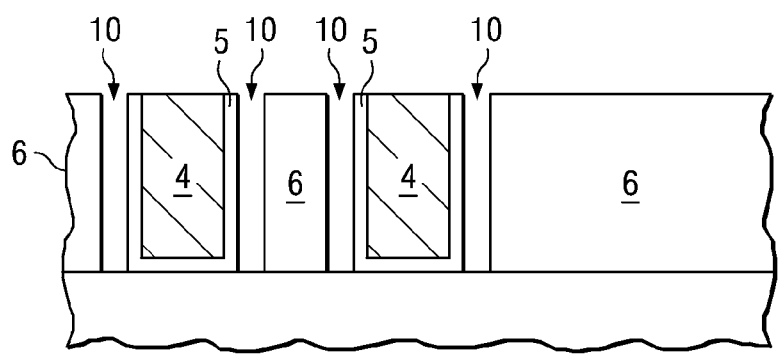
Figure 1C:
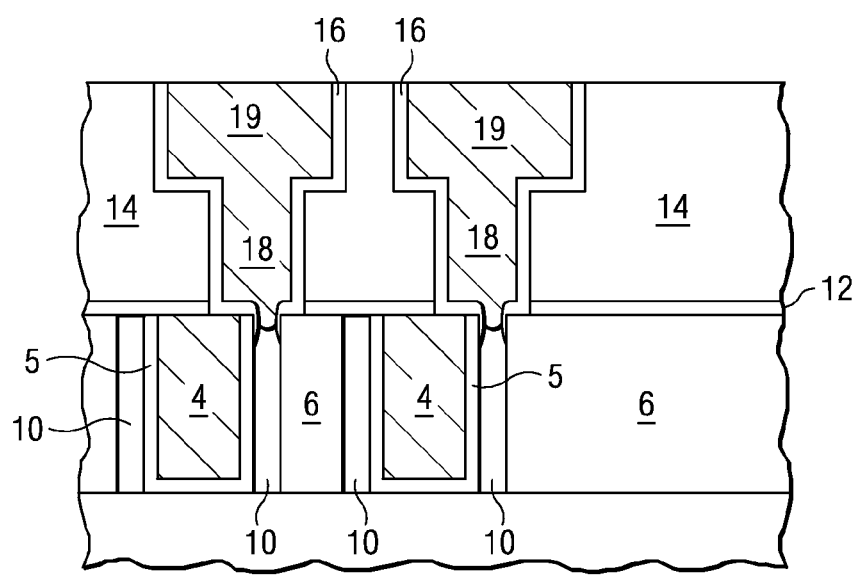
Figure 2:
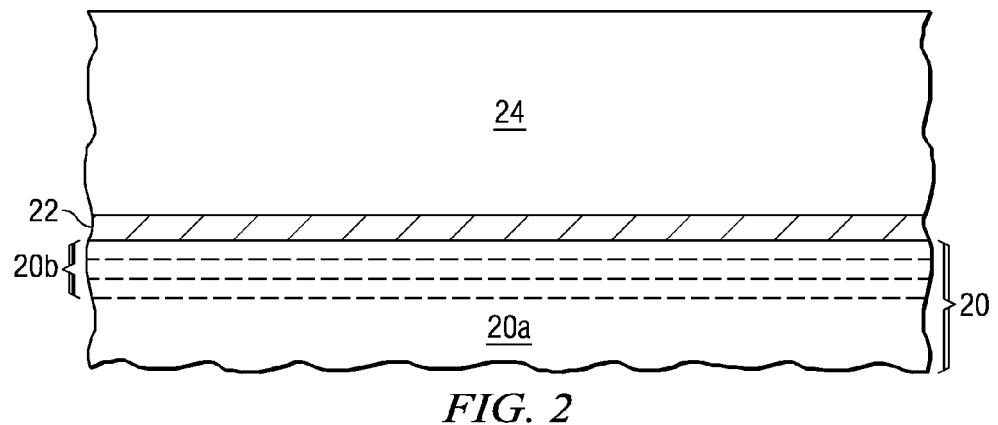
FIGS. 2 through 10B are cross-sectional views of intermediate stages in the manufacturing of an embodiment of the present invention, wherein a single damascene structure is formed.

FIGS. 2 through 10B are cross-sectional views of intermediate stages for forming a single damascene structure. FIG. 2 illustrates a starting structure, which includes etch stop layer (ESL) 22 on base layer 20, and dielectric layer 24 on ESL 22. Base layer 20 is used to symbolize a semiconductor substrate 20a and overlying layers 20b, which are between ESL 22 and semiconductor substrate 20a. Semiconductor substrate 20a may include a single crystalline or a compound semiconductor material. Active devices (not shown) such as transistors may be formed at the top surface of semiconductor substrate 20a. Conductive features (not shown), such as metal lines, contact plugs or vias, may be included in layers 20b.

ESL 22 may be formed on an inter-layer dielectric or an inter-metal dielectric. Preferably, ESL 22 has a dielectric constant of less than about 5.0, and may comprise materials such as SiC, SiCN, SiCO, SiN, carbon-based materials, and combinations thereof.

In an exemplary embodiment, dielectric layer 24 has a low dielectric constant (k value), preferably lower than about 3.0, hence is referred to as low-k dielectric layer 24 throughout the description. More preferably, low-k dielectric layer 24 has a k value of less than about 2.5, and hence is sometimes referred to as an extreme low-k (ELK) dielectric layer. Low-k dielectric layer 24 may include carbon-containing dielectric materials, and may further contain nitrogen, hydrogen, oxygen, and combinations thereof. A porous structure may be used for lowering the k value. The preferred thickness of low-k dielectric layer 24 is between about 1000 Å and about 3500 Å. One skilled in the art will realize, however, that the dimensions recited throughout the description are related to the technology used for forming the integrated circuits, and will reduce with the down-scaling of the forming technology.

Figure 3:
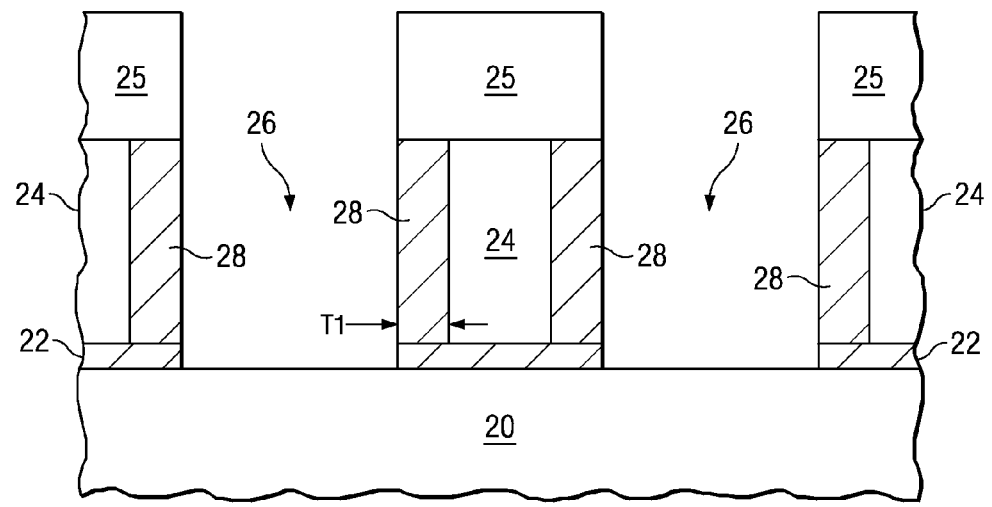

FIG. 3 illustrates the formation of trenches 26, which are preferably formed by applying and patterning photo resist 25, and then etching low-k dielectric layer 24. The exposed ESL 22 is then etched, followed by the removal of photo resist 25, preferably by ashing. During the formation of trenches 26, surface portions of low-k dielectric layer 24 that are exposed to trenches 26 are damaged by the etching process and ashing process. In an exemplary embodiment, low-k dielectric layer 24 includes Si—O—$CH_3$ terminals, and the etching and ashing processes cause complex chemical reaction and result in the loss of $CH_3$ terminals, and the generation of OH terminals. As a result, the k value of the damaged layers 28 is adversely increased. For example, the damaged layers 28 may have a k value as high as about 7. Thickness T1 of damaged layers 28 is related to the etching and ashing processes, such as the etchant, the ashing gases and the etching and ashing durations. In an exemplary embodiment, thickness T1 of damaged layers 28 may be between about 50 Å and 250 Å.

Figure 4:
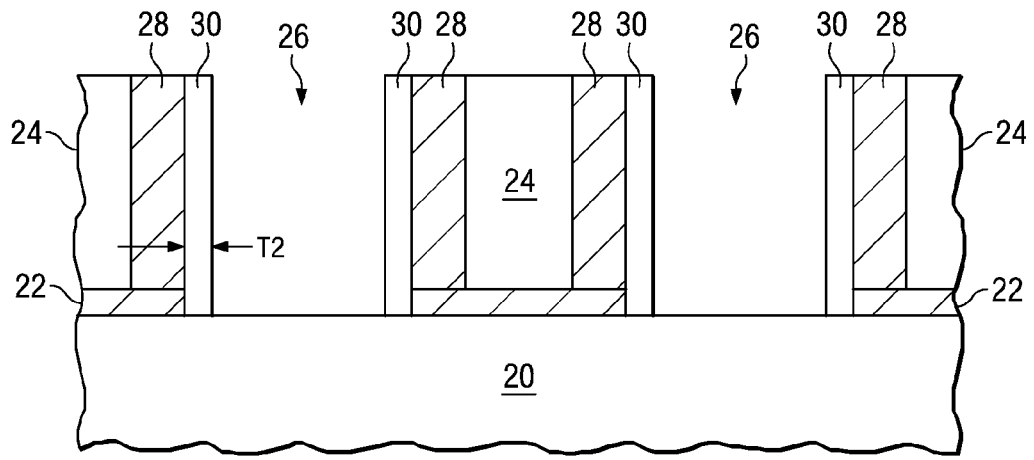

FIG. 4 illustrates the optional formation of sidewall protection layers 30. Preferably, sidewall protection layers 30 are used to prevent the subsequently formed diffusion barrier layers 32 (refer to FIG. 10B) from being exposed to air-gaps, which may cause diffusion barrier layer 32's ability for preventing the electro-migration of metal lines to be degraded. In an exemplary embodiment, sidewall protection layers 30 are formed of dielectric materials such as SiC, FSG, LK, and combinations thereof. Sidewall protection layers 30 preferably have thickness T2 of between about 20 Å and about 150 Å. In subsequently discussed drawings, sidewall protection layers 30 are not illustrated.

Figure 5:
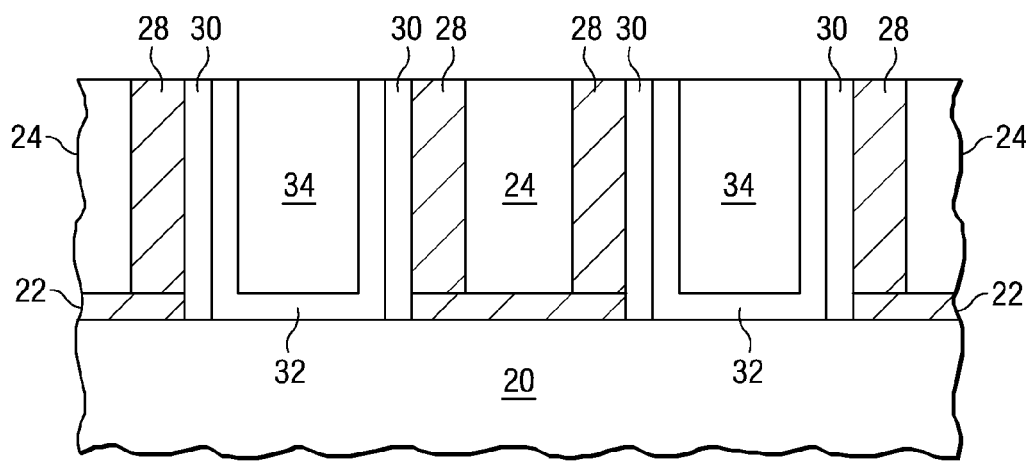

FIG. 5 illustrates the formation of conductive lines, including diffusion barrier layers 32 and metal lines 34, in trenches 26. FIG. 5 also illustrates the optional sidewall protection layers 30. For simplicity purposes, in subsequent drawings, sidewall protection layer 30 may be omitted. Diffusion barrier layers 32 preferably include titanium, titanium nitride, tantalum, tantalum nitride, or other alternatives, and may be formed using physical vapor deposition (PVD) or one of the chemical vapor deposition (CVD) methods. The thickness of diffusion barrier layers 32 may be between about 20 Å and about 200 Å.

Metal lines 34 preferably include copper or a copper alloy, although it may include other conductive materials, such as silver, gold, tungsten, aluminum, and the like. As is known in the art, the steps for forming metal lines 34 may include blanket depositing a thin seed layer of copper or copper alloy on diffusion barrier layers 32. A conductive material is then filled into trenches 26, preferably by plating. A chemical mechanical polish (CMP) is then performed to remove the excess diffusion barrier layer and the conductive material on low-k dielectric layer 24, leaving diffusion barrier layers 32 and copper metal lines 34 in trenches 26.

Figure 6:
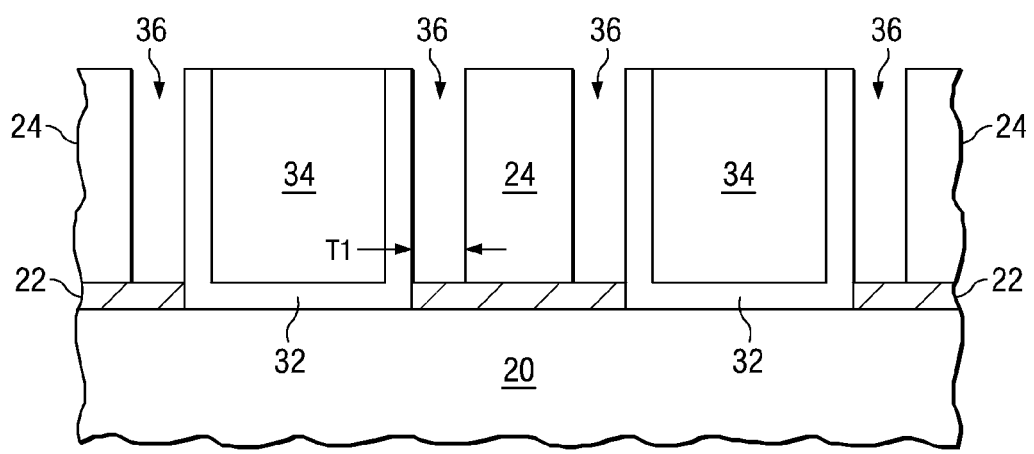

FIG. 6 illustrates the selective removal of damaged layers 28. The damaged layers 28 may be selectively removed using a diluted HF-based solution to form air-gaps 36. The thickness of air-gaps 36 may be between about 50 Å and about 300 Å, which may be equal to, or slightly greater than, the thickness T1 of damaged layers 28, since portions of dielectric layer 24 exposed through openings 36 may also be removed in the formation of air-gaps 36.

Figure 7:
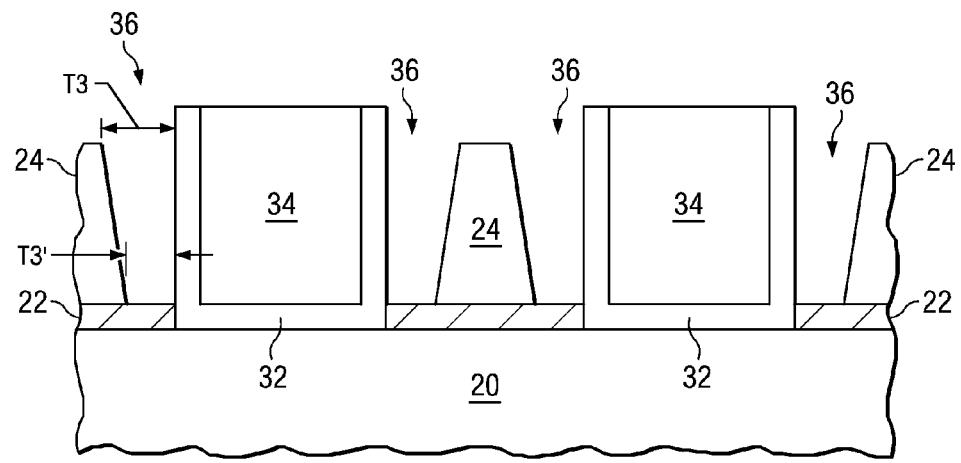

Due to the small width T1 of air-gaps 36, it may be difficult to fill materials into air-gaps 36 in subsequent process steps. FIG. 7 illustrates an optional step to widen air-gaps 36, which may be performed by an argon treatment (bombardment). As a result, top width T3 of the top portions of air-gaps 36 is increased over bottom width T3' by greater than about 50 percent. The argon treatment may also cause the top surface of low-k dielectric layer 24 to be recessed.

Figure 8:
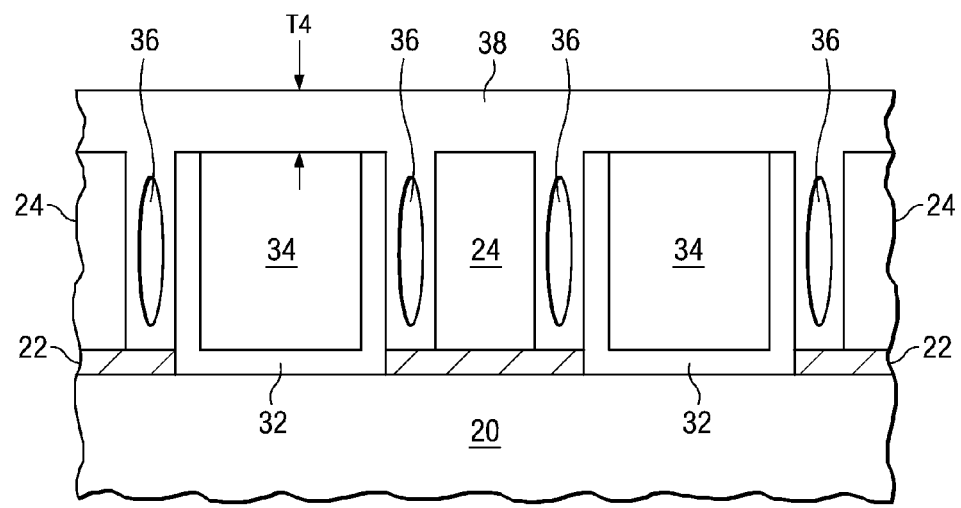

In FIG. 8, filler dielectric material 38 is blanket deposited, and hence filled into air-gaps 36. Dielectric material 38 preferably has a k value lower than the k value of the subsequently formed capping layer (which may be an etch stop layer, or ESL) 40 (refer to FIGS. 10A and 10B). More preferably, the k value of filler dielectric material 38 is substantially close to the k value of low-k dielectric layer 24, and may be less than about 2.9. Filler dielectric material 38 and low-k dielectric layer 24 may be formed of different materials, or substantially the same materials, but having different porosities, and hence different k values. In an exemplary embodiment, filler dielectric material 38 may be composed of fluorosilicate glass (FSG), low-k dielectric materials, and extreme low-k dielectric materials. The thickness T4 of filler dielectric material 38 may be between about 50 Å and 300 Å. In an embodiment, air-gaps 36 are substantially fully filled. In other embodiments, due to the high aspect ratio of air-gaps 36, remaining air-gaps 36 may be left.

Figure 9A:
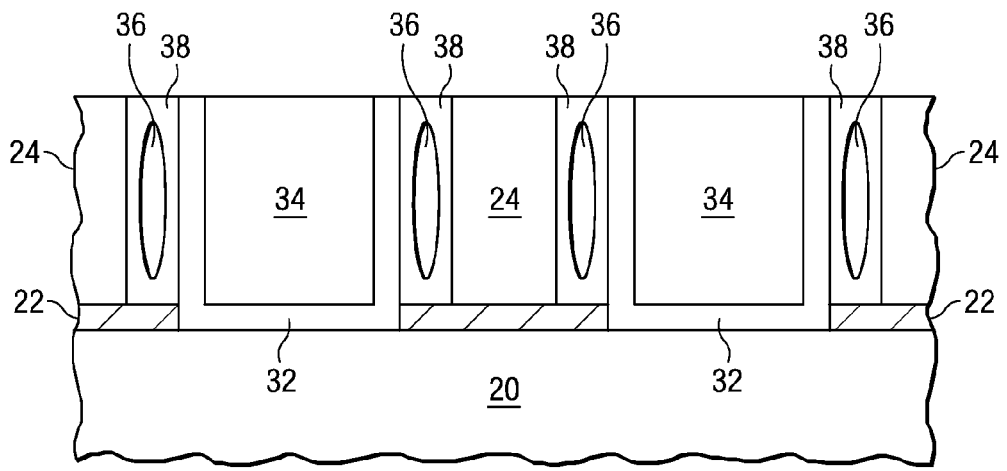
Figure 9B:
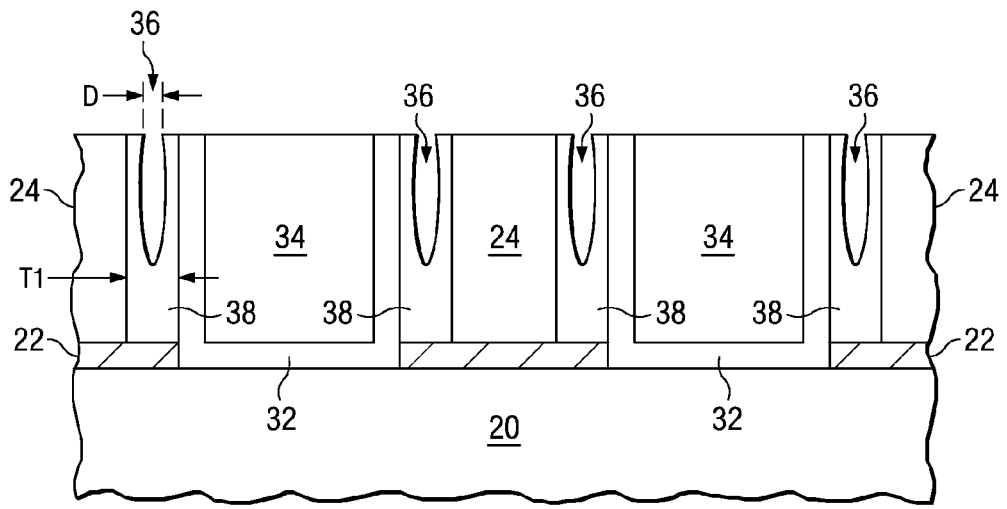
Figure 9C:
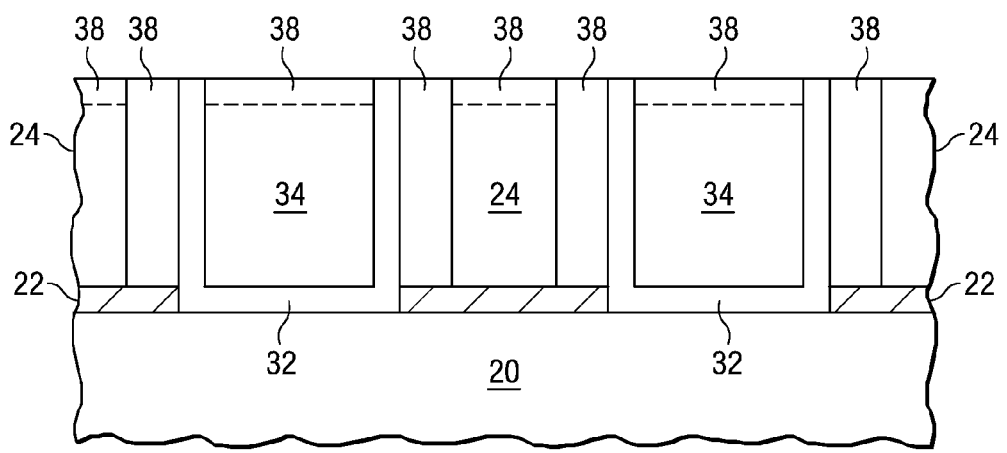

FIGS. 9A through 9C illustrate the removal of excess portions of filler dielectric material 38. In an embodiment, the removal is performed using CMP, which may last for only about 20 seconds. In alternative embodiments, the removal is performed using anisotropic etch. FIG. 9A illustrates an embodiment wherein the tops of the remaining air-gaps 36 are sealed by remaining filler dielectric material 38. This embodiment may be achieved by adjusting the process conditions for filling filler dielectric material 38. Alternatively, as shown in FIG. 9B, air-gaps 36 are exposed. However, the top width D of air-gaps 36 is less than width T1 of the original air-gaps 36 (refer to FIG. 6). This advantageously reduces the likelihood of forming a discontinuous diffusion barrier layer in the subsequent via-formation process. The remaining air-gaps 36 also contribute to the reduction in parasitic capacitance. FIG. 9C illustrates a resulting structure when filler dielectric material 38 fully fills air-gaps 36. Please note that in each of the FIGS. 9A, 9B, and 9C, filler dielectric material 38 may extend on top of low-k dielectric layer 24 if the top surface of low-k dielectric layer 24 is recessed by the argon treatment, and the resulting structure is shown in FIG. 9C using dotted lines.

Figure 10A:
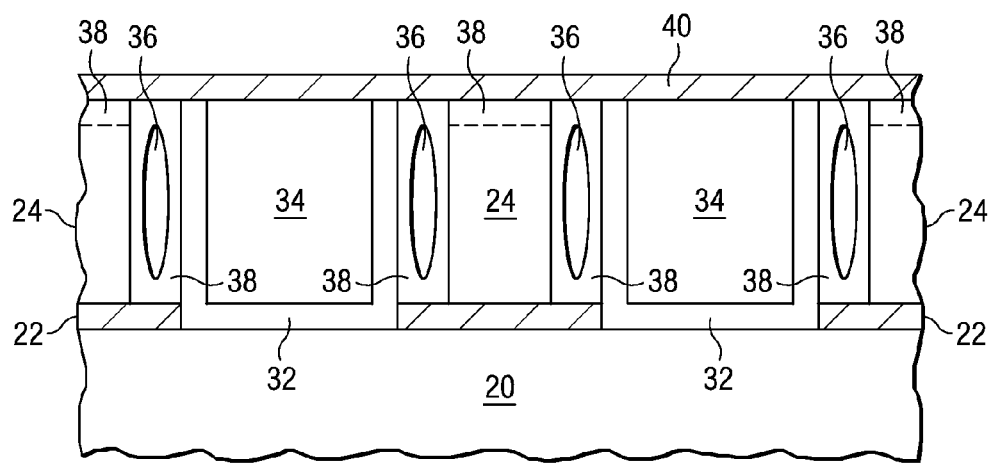
Figure 10B:
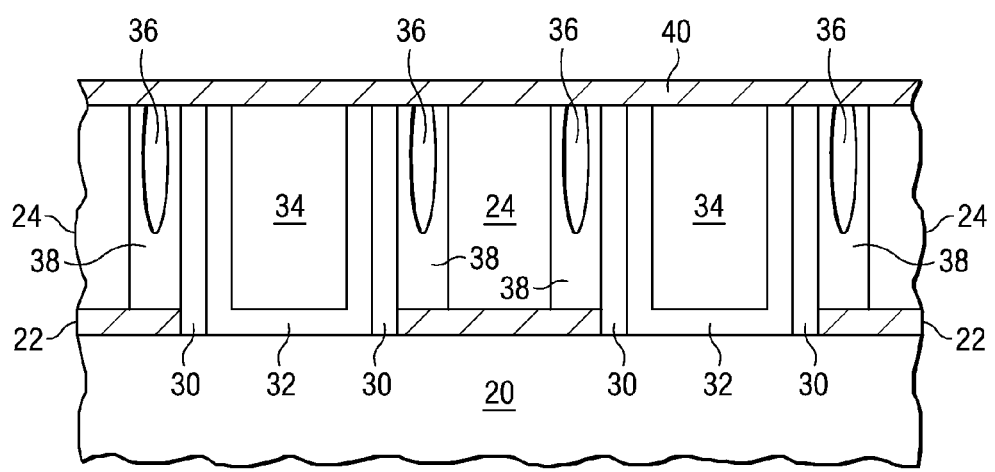

Referring to FIGS. 10A and 10B, etch stop layer (ESL) 40 is formed. Preferably, ESL 40 is formed of SiC, SiCN, or other commonly used materials. In FIG. 10A, air-gaps 36 are fully enclosed by filler dielectric material 38, and hence are separated from ESL 40 by a layer of filler dielectric material 38. Dotted lines are used to mark the formation of filler dielectric material 38 on the top of low-k dielectric layer 24, which is likely to occur if an argon treatment is performed to recess the top surface of low-k dielectric layer 24. In FIG. 10B, the bottom surface of ESL 40 is exposed to air-gaps 36. The optional sidewall protection layers 30, as discussed in the preceding paragraphs, are also illustrated in FIG. 10B.

Figure 11:
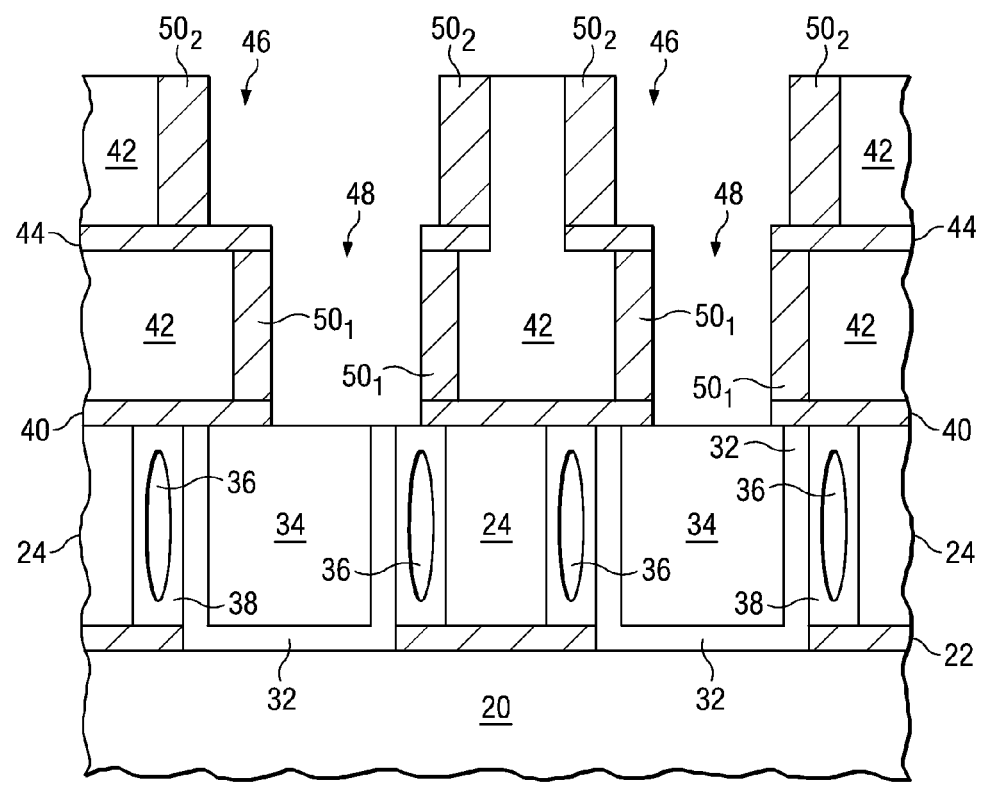
FIGS. 11 and 12 are cross-sectional views of intermediate stages in the manufacturing of an embodiment of the present invention, wherein a dual damascene structure is formed.
Figure 12:
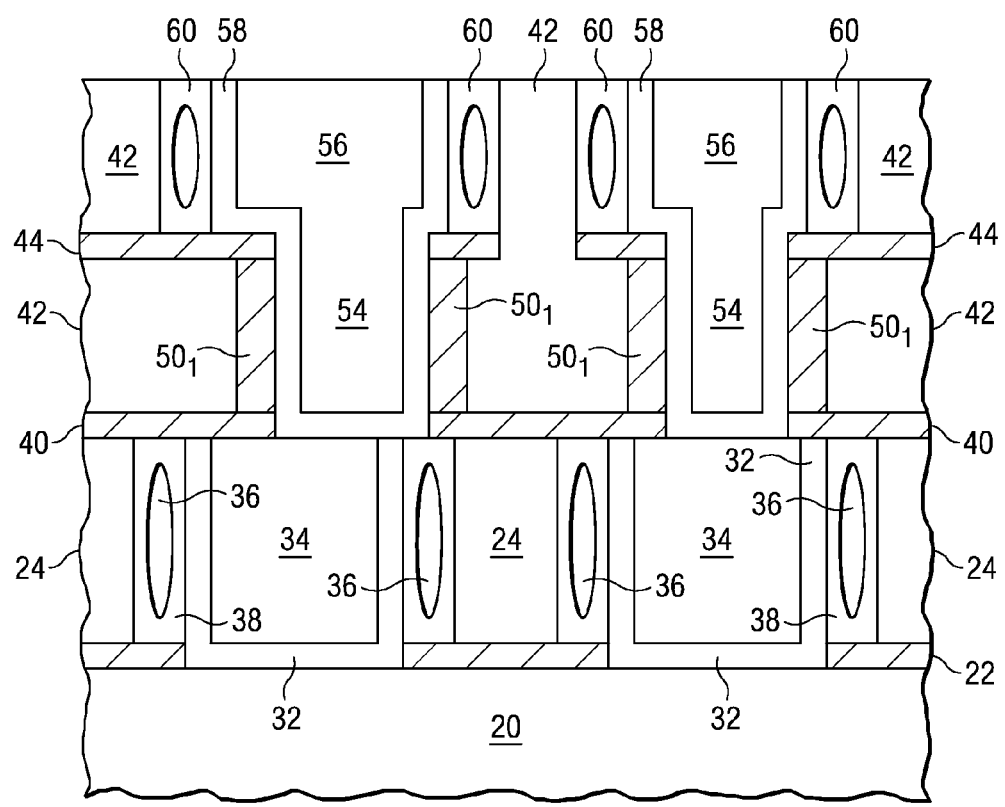

FIGS. 11 and 12 illustrate the formation of a dual damascene structure. Referring to FIG. 11, inter-metal dielectric (IMD) layer 42 is formed, which preferably has a low k value, and may include essentially the same materials as low-k dielectric layer 24. ESL 44 may be formed in IMD layer 42. Trenches 46 and via openings 48 are then formed in IMD layer 42. As is known in the art, photo resists (not shown) may be formed and patterned over IMD layer 42 to aid the formation of via openings 48 and trenches 46. In the preferred embodiment, an anisotropic etch cuts through IMD layer 42 and stops at ESL 40, thereby forming via openings 48. Trenches 46 are then formed, wherein ESL 44 is used to stop the etching. In alternative embodiments, a trench-first approach is taken, in which trenches 46 are formed prior to the formation of via openings 48. ESL 40 is then etched through via openings 48, exposing underlying conductive metal lines 34. Due to the damage caused by the respective etching and ashing, damaged layers 50, which include via portions $50_1$ and trench portions $50_2$, are formed.

Referring to FIG. 12, vias 54 and conductive lines 56 are formed by filling via openings 48 and trenches 46, respectively. Diffusion barrier layers 58 are also formed. In subsequent steps, the trench portions $50_2$ of the damaged layers are removed and filled with a filler dielectric material 60, which preferably has a lower k value than the overlying ESL (not shown), wherein filler dielectric material 60 and the respective formation process may be essentially the same as in filler dielectric material 38.

To show the advantageous features of the present invention, one of the vias 54 is shown as misaligned with a portion not landed on the respective metal line 34 and diffusion barrier layer 32. Since air-gaps 36 have been at least reduced in width than the width of damaged layers 28 (refer to FIG. 5), and possibly fully sealed or filled, ESL 40 and diffusion barrier layers 58 are less likely to be discontinuous, and the copper in vias 54 will be prevented from diffusing into low-k dielectric layer 24. Furthermore, the sidewall protection layer 30 discussed in FIG. 4 and FIG. 5 can also be integrated into the structures shown in FIGS. 11 and 12.

The embodiments of the present invention have several other advantageous features. By removing the damaged portion of low-k dielectric 24 and filling the resulting air-gaps with a low-k dielectric material, the equivalent k values of dielectric materials in the interconnect structures are reliably reduced. Electro-migration is thus reduced and time dependent dielectric breakdown (TBBD) performance of the interconnect structures is improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a low-k dielectric layer over a semiconductor substrate;
   forming a conductive line in the low-k dielectric layer;
   after the step of forming the low-k dielectric layer, forming a filler dielectric material at a same level as, and between, the conductive line and the low-k dielectric layer, wherein the filler dielectric material contacts the low-k dielectric layer; and
   forming a dielectric layer over and contacting the filler dielectric material and the low-k dielectric layer, wherein the filler dielectric material has a k value lower than a k value of the dielectric layer.

2. The method of claim 1, wherein the step of forming the filler dielectric material comprises:
   removing a damaged layer of the low-k dielectric layer to form an air-gap, wherein the damaged layer has a higher k value than undamaged portions of the low-k dielectric layer;
   blanket depositing the filler dielectric material, wherein a portion of the filler dielectric material is filled into the air-gap; and
   removing excess portions of filler dielectric material higher than the conductive line.

3. The method of claim 2, wherein the step of removing the damaged layer of the low-k dielectric layer comprises dipping the low-k dielectric layer in a HF based solution.

4. The method of claim 2, wherein the damaged layer contacts the conductive line.

5. The method of claim 2 further comprising, before the step of forming the filler dielectric material, performing an argon treatment to widen a top portion of the air-gap to be greater than a bottom portion of the air-gap.

6. The method of claim 1 further comprising, before the step of forming the conductive line, forming a sidewall protection layer, wherein the conductive line contacts the sidewall protection layer.

7. A method comprising:
   forming a low-k dielectric layer over a semiconductor substrate;
   forming a conductive line in the low-k dielectric layer, wherein during the step of forming the conductive line, a k value of a portion of the low-k dielectric layer adjacent the conductive line is increased, forming a damaged layer;
   removing the damaged layer to form an air-gap;
   filling a filler dielectric material into the air-gap;
   planarizing the filler dielectric material until the conductive line is exposed; and
   forming an etch stop layer over the filler dielectric material and the low-k dielectric layer.

8. The method of claim 7, wherein the filler dielectric material has a k value lower than a k value of the etch stop layer.

9. The method of claim 7, wherein the filler dielectric material is formed of a same material as the low-k dielectric layer.

10. The method of claim 7, wherein the filler dielectric material and the low-k dielectric layer are formed of different materials.

11. The method of claim 7, wherein the step of forming the conductive line comprises:
    applying and patterning a photo resist over the low-k dielectric layer;
    etching the low-k dielectric layer to form an opening;
    performing an ashing step to remove the photo resist using an oxygen-containing gas, wherein the portion of the low-k dielectric layer is damaged during the ashing step; and
    forming the conductive line in the opening.

12. The method of claim 11 further comprising:
    after the step of performing the ashing step and before the step of forming the conductive line, forming a sidewall protection layer in the opening and on a sidewall of the damaged layer.

13. The method of claim 7 further comprising, before the step of filling the filler dielectric material in the air-gap, widening a top portion of the air-gap.

14. The method of claim 13, wherein the step of widening comprises performing an argon treatment to the filler dielectric material.

15. A method comprising:
    forming a low-k dielectric layer over a semiconductor substrate;
    forming an opening in the low-k dielectric layer, wherein the step of forming the opening comprises an ashing step, and wherein a k value of a damaged portion of the low-k dielectric layer exposed to the opening is increased during the ashing step;
    forming a conductive line in the low-k dielectric layer and contacting the damaged portion of the low-k dielectric layer;
    removing the damaged portion to form an air-gap;
    filling a filler dielectric material into a portion of the air-gap, wherein a remaining portion of the air-gap exists after the step of filling the filler dielectric material;
    planarizing the filler dielectric material until the conductive line is exposed; and
    forming an etch stop layer over the filler dielectric material and the low-k dielectric layer, wherein the remaining portion of the air-gap exists after the step of forming the etch stop layer.

16. The method of claim 15, wherein the filler dielectric material has a k value lower than a k value of the etch stop layer.

17. The method of claim 15, wherein the filler dielectric material is formed of a same material as the low-k dielectric layer.

18. The method of claim 15, wherein the filler dielectric material and low-k dielectric layer are formed of different materials.

19. The method of claim 15, wherein after the step of planarizing the filler dielectric material, the remaining portion of the air-gap is exposed to open air.

20. The method of claim 15, wherein after the step of planarizing the filler dielectric material, the remaining portion of the air-gap is fully enclosed by the filler dielectric material.

* * * * *